United States Patent [19]

Hartsough et al.

[11] 4,125,446

[45] Nov. 14, 1978

[54] CONTROLLED REFLECTANCE OF SPUTTERED ALUMINUM LAYERS

[75] Inventors: Larry D. Hartsough; Paul S. McLeod, both of Berkeley, Calif.

[73] Assignee: Airco, Inc., Montvale, N.J.

[21] Appl. No.: 824,682

[22] Filed: Aug. 15, 1977

[51] Int. Cl.$^2$ .............................................. C23C 15/00
[52] U.S. Cl. ................................ 204/192 P; 204/192 C
[58] Field of Search ............. 204/192 C, 192 P, 192 D

[56] References Cited

U.S. PATENT DOCUMENTS

| | | | |
|---|---|---|---|
| 1,982,774 | 12/1934 | Winkler | 204/192 P |
| 3,267,015 | 8/1966 | Morley | 204/192 P |
| 3,616,402 | 10/1971 | Kumagai | 204/192 C |
| 3,890,109 | 6/1975 | Jones | 204/192 C |
| 3,897,325 | 7/1975 | Hoshima et al. | 204/192 P |
| 3,907,660 | 9/1975 | Gillery | 204/192 P |
| 3,962,062 | 6/1976 | Ingrey | 204/192 P |
| 4,024,041 | 5/1977 | Hanazono et al. | 204/192 C |

OTHER PUBLICATIONS

L. F. Drummeter, Jr., "Solar Absorptance and Thermal Emittance of Evaporated Coatings," Physics of Thin Films, vol. 2, pp. 333–339, Academic Press, 1964.

G. S. Ash, "What Mirror" Opt. Spectra, vol. 9, pp. 29–30, Feb. 1975.

A. J. Learn, "Evolution and Current Status of Aluminum Metallization," Electrochem. Soc., Sol. Sta. Sci. and Tech., vol. 123, No. 6, pp. 894–906.

L. D. Hartsough and P. S. McLeod, "High-Rate Sputtering of Enhanced Aluminum Mirrors," Journal of Vac. Sci. Technol., vol. 14, No. 1, pp. 123–126.

Primary Examiner—John H. Mack
Assistant Examiner—William Leader
Attorney, Agent, or Firm—David A. Draegert; Edmund W. Bopp; Larry R. Cassett

[57] ABSTRACT

A method for depositing aluminum layers having a predetermined reflectance or a predetermined resistivity is disclosed. The layers are deposited by sputtering a target comprising 90% or greater aluminum. The parameters which must be controlled include the partial pressure of reactive gases, such as nitrogen, hydrogen, oxygen and water vapor, which are minor constituents of the sputtering gas, the total sputtering gas pressure, the substrate temperature, and the deposition rate.

11 Claims, 2 Drawing Figures

CONTROLLED REFLECTANCE OF SPUTTERED ALUMINUM LAYERS

BACKGROUND OF THE INVENTION

The invention is in the field of sputtering methods for the deposition of metal coatings.

The deposition of aluminum films by vacuum vapor deposition is well-known. One use of such films is as a mirror or infrared reflector. Previously films having the highest reflectance have been prepared by vacuum evaporation of pure aluminum at high rates and at low absolute pressures which minimize the contamination of the films by oxygen and other readily absorbable gases. The preparation and properties of such films are discussed by Lewis F. Drummeter, Jr. and Georg Hass on pp. 333–339 of a chapter "Solar Absorptance and Thermal Emittance of Evaporated Coatings" which appears in "Physics of Thin Films", Georg Hass and Rudolph E. Thun, editors, Vol. 2, Academic Press, New York (1964).

A second use of aluminum layers in the metalization of intergrated circuits and other solid state electronic components. Such use is discussed by Arthur J. Learn, in "Evolution and Current Status of Aluminum Metalization", J. Electrochem. Soc., Sol. State Sci. and Tech., pp. 894–906, June (1976). Many component manufacturers use automatic mask-aligning equipment which requires metal layers having high specular reflectance. Other manufacturers use positive photoresist techniques for which non-specular reflecting films are preferred. In addition to layers of essentially pure aluminum, many applications require layers of aluminum alloys, such as Al — 2% Si and Al — 4% Cu — 2% Si. Because different elements have different vapor pressures, alloys can be difficult to deposit by evaporation techniques. In contrast, deposition of alloy layers by sputtering is relatively easy.

Many previous attempts to deposit thick aluminum layers by sputtering were unsatisfactory or uneconomical because the deposition rates were too low. Advances in magnetically enhanced sputtering apparatus now provide much higher deposition rates. In particular, sputtering sources of the type disclosed by John S. Chapin in "The Planar Magnetron", Research/Development, Vol. 25, No. 1 (January 1974) enable deposition rates which are comparable to those typically obtained by electron-beam heated evaporation equipment. Magnetron sputtering sources are also advantageous in that they confine the glow discharge plasma to a closed loop adjacent target, and thus reduce electron bombardment and other heating of the substrate.

SUMMARY OF THE INVENTION

Very generally, the present invention relates to methods for depositing aluminum layers by sputtering. The sputtering target may be essentially pure aluminum, or it may be an aluminum alloy containing up to about 10% of other metals. Target materials consisting essentially of 99% or greater Al, Al — 2% Si, and Al — 4% Cu — 2% Si are particularly preferred. A predetermined reflectance of a deposited layer can be reproducibly obtained by accurate control of certain deposition parameters. One such parameter is the partial pressure of various reactive gases, such as nitrogen, hydrogen, oxygen, and water vapor, which are minor constituents of the sputtering gas. Such partial pressures in the range $10^{-7}$ to $10^{-4}$ torr are preferred. Other important parameters are the total sputtering gas pressure, the substrate temperature, and the deposition rate. The preferred ranges are $5 \times 10^{-4}$ to $5 \times 10^{-2}$ torr total pressure, 30° to 250° C initial substrate temperature, and greater than 10 nm/sec deposition rate.

Proper selection of parameters allows the deposition of aluminum films which have specular reflectance at least as high as the best layers deposited by vacuum evaporation. Further, a particular less — than — maximum reflectance is easily obtained by simply selecting a predetermined partial pressure of one minor constituent of the sputtering gas.

As the reflectance decreases, the electrical resistivity increases. Both effects are believed to result from an increasing density of crystallites, commonly called hillocks, which grow normal to the plane of the film at a faster rate than the other crystallites. Such hillocks may not be a problem in films of thickness less than about 0.5 $\mu$m. The effects of the hillocks increase as the thickness increases. The method of the invention is particularly useful for film thicknesses greater than 0.5 $\mu$m thick.

DESCRIPTION OF THE PREFERRED EMBODIMENTS

Figure 1:
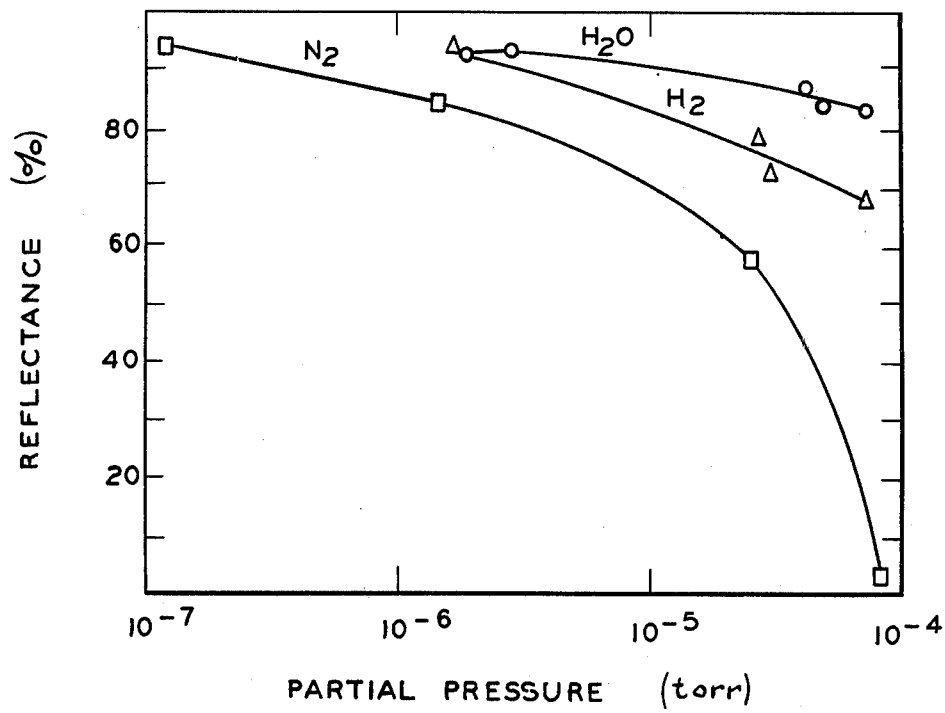
FIG. 1 is a graph which illustrates the specular reflectance of 1.2 $\mu$m thick aluminum layers as a function of the partial pressure of nitrogen (squares), hydrogen (triangles) and water vapor (circles) which is present in the sputtering gas.

Aluminum layers were deposited using conventional coating apparatus. The target was a 0.4 × 3.5 × 8.25 inch plate which was mounted to a model HRC-373 planar magnetron sputtering source which is commercially available from Airco Temescal, Berkeley, California. The sputtering source was mounted in an evacuable chamber which had suitable connectors for providing electrical power and cooling water to the sputtering source.

Most of the aluminum layers were made in an in-line coating system comprising an entrance lock, a coating chamber, and an exit lock. The substrates were placed on a 30 × 36 cm tray and translated in a horizontal plane above the horizontal sputtering target.

Some of the aluminum layers were made in an Airco Temescal model HRS-3 sputtering system in which the sputtering target was in a vertical plane and the vertical substrates passed by the target on a rotating carousel. This system also included lamps for heating the substrates up to 250° C. The temperature was monitored by a thermocouple in a stainless-steel jacket attached to the front side of a substrate.

The coating chambers were evacuated in a conventional manner with turbomolecular vacuum pumps. A separate cryopump was used with the in-line system to reduce the quantity of condensible vapor inside the chamber. The vacuum pumps were not throttled. The partial pressure of a minor constituent gas in the chamber could be controlled by regulating the flow of gas into the chamber with a metering valve. The residual gas was analyzed with a UTI model 100C quadrupole mass spectrometer. The total sputtering gas pressure was measured with a capacitance manometer and automatically controlled by regulating the flow of the major constituent gas.

In preparation for coating, the coating chamber was first evacuated to a pressure of less than $5 \times 10^{-6}$ torr. The desired minor constituent gas was fed into the chamber to establish the desired partial pressure. Next the chamber was backfilled with argon or other ionizable inert gas to obtain the desired total gas pressure in the range 0.5 to 50 millitorr. Pressures in the range 1 to 25 millitorr are preferred. A dc voltage of 300 to 600 V was applied to the target. As the sputtering gas pressure increased, the voltage decreased.

During coating, the substrate passed by the target one or more times at a distance of 3 to 9 cm. At the shorter distances the coating may have been affected by the glow discharge plasma which is magnetically confined to a closed loop adjacent the target. Layers were deposited at a rate of 10 to 15 nm/sec with sputtering powers of 3 to 5 kW. In general, higher deposition rates gave higher reflectance.

The reflectance was also influenced by several other interrelated effects. The reflectance increased with increased source — to — substrate distances up to about 6 cm. The reflectance also increased with increased sputtering gas pressure up to about $15 \times 10^{-3}$ torr. Further, increases in source — to — substrate distance and total gas pressure only lowered the deposition rate. Vapor shields installed close to the sides of the substrate to prevent sputtered material from arriving at low angles also improved the reflectance.

EXAMPLES

One set of coatings was prepared in the in-line system by sputtering a target of 99.995% aluminum. The coating chamber was evacuated to $2 \times 10^{-7}$ torr. A particular partial pressure of nitrogen, hydrogen or water vapor was established and 99.999% argon was added to maintain a sputtering gas pressure of $15 \times 10^{-3}$ torr. The glass substrates passed by the sputtering target at a distance of 6.2 cm and a speed of 6.3 cm/min. A layer approximately 1.2 μm thick was deposited at a rate of 15 nm/sec. The sputtering power was 4.6 kW with a potential of 380 V and a current of 12 A.

Several properties of the first series of coatings were measured. First, the specular reflectance was measured with a Cary model 14 R spectrophotometer calibrated at 633 nm. FIG. 1 illustrates the reflectance at a wavelength of 500 nm as a function of partial pressure of the different minor gases. For nitrogen, the data indicate that the specular reflectance decreased steadily from about 93% for a partial pressure of $10^{-7}$ torr, to about 70% at $10^{-5}$ torr, and to about 5% at $10^{-4}$ torr. The variation in the reflectance for hydrogen and water vapor is much less.

The electrical resistivity of the coatings was measured with a four-point probe. For partial pressures of minor constituent gases less than $10^{-6}$ torr the resistivity was near 2.65 μohms.cm, the value for bulk aluminum. The resistivity increased as the partial pressure increased. Data for nitrogen are given in the Table. The increase in resistivity was much less for hydrogen and water vapor. At a partial pressure of $7.5 \times 10^{-5}$ torr for hydrogen the resistivity was 3.0 μohms.cm; at $9.4 \times 10^{-5}$ torr of water vapor, the resistivity was 2.8 μohms.cm.

TABLE

Electrical Resistivity Of Aluminum Films As A Function Of Partial Pressure Of Nitrogen

| Resistivity (μohm.cm) | Partial Pressure (torr) |
|---|---|
| 2.7 | $0.12 \times 10^{-6}$ |
| 3.2 | 7.0 |
| 4.4 | 26 |
| 6.7 | 82 |

The layers were also examined with a scanning electron microscope. The resulting micrographs indicated that increased substrate temperature and increased partial pressure of the minor constituents were accompanied by increased size and a greatly increased number of hillocks observable on the surface of the coating. It is believed that this variation in the microstructure of the coating is responsible for the variations in the reflectance and resistivity.

There are several possible explanations for the much greater effects of nitrogen as compared with hydrogen and water vapor. Because aluminum hydride is less chemically stable that aluminum nitride, a deposited layer probably absorbs less hydrogen than nitrogen at the same partial pressure. Aluminum is more chemically reactive with nitrogen than with water vapor. Further, water vapor may be more easily gettered on the chamber walls. Because of the presence of the glow discharge, it is likely that some of the water vapor was decomposed into hydrogen and oxygen.

A second set of example coatings were prepared by sputtering a target of 99.999% aluminum in the HRS-3 system. Only 99.999% argon was added to maintain a pressure of $1.6 \times 10^{-3}$ torr. The base pressure of the system was about $5 \times 10^{-6}$ torr. The substrates were heated in the chamber just before coating. The $0.1 \times 5 \times 5$ cm glass substrates made about 720 passes by the target at a distance of 4.5 cm and a speed of 80 m/min. The power was 3.6 kW with a potential of 600 V and a current of 6 A. A layer about 1.2 μm thick was deposited at a rate of 10 nm/sec.

Figure 2:
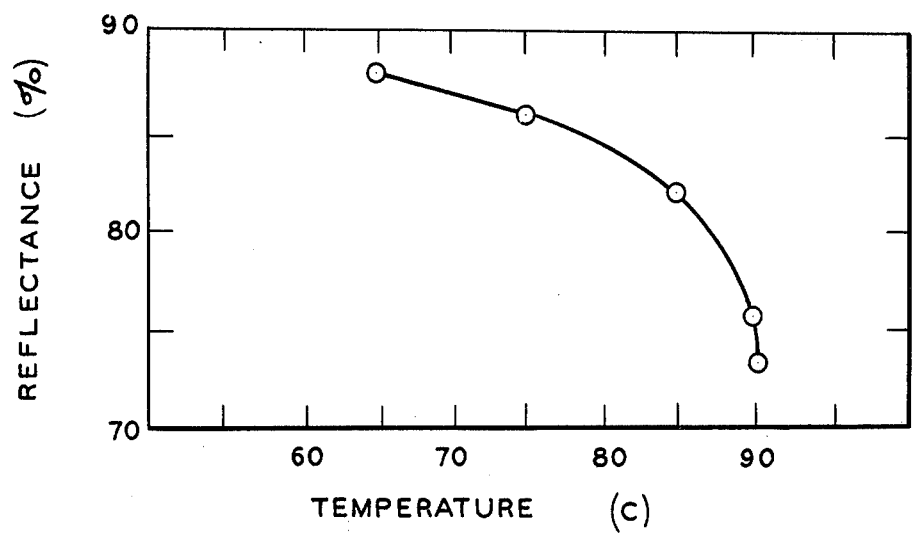
FIG. 2 is a graph which illustrates the specular reflectance of 1.2 $\mu$m thick aluminum films as a function of the initial substrate temperature.

FIG. 2 illustrates the specular reflectance (wavelength 500 nm) of the layers as a function substrate temperature at the initiation of coating. The reflectance always decreases as the initial temperature increased and decreased rapidly for initial substrate temperature exceeding 85° C. Despite decreased reflectance, high substrate temperatures during deposition may be desired because of the effect on some other important property.

During deposition the substrate temperature rises, typically by 50° to 100° depending upon the deposition and cooling rates. It is believed that condensation of the deposited material is the primary cause of the rise in substrate temperature.

The temperature rise can be minimized by proper cooling of the substrate. At a given deposition rate, the temperature rise increases with the thickness of the coating. However, the reflectance of a 2.2 μm layer deposited in a single pass on a silicon substrate with a heat sink was comparable to that of a 1.2 μm layer without a heat sink. In this experiment, the heat sink was made by coating the back surface of the silicone substrate with vacuum grease and pressing it onto a glass disk. The temperature rise can also be reduced by coating in multiple passes and allowing time for the substrate to cool between passes.

What is claimed is:

1. A method for depositing an aluminum layer having a predetermined reflectance comprising:

placing a target comprising at least 90% aluminum and a substrate in a evacuable chamber;

evacuating the chamber;

introducing a reactive gas into the chamber at a controlled rate to provide a predetermined partial pressure of $10^{-7}$ to $10^{-4}$ torr;

providing an ionizable inert gas in the chamber to maintain the total pressure of $5 \times 10^{-4}$ to $5 \times 10^{-2}$ torr;

and applying an electric potential to the target to sputter the target and deposit a layer of material on the substrate.

2. The method according to claim 1 wherein the reactive gas is selected from the group consisting of nitrogen, hydrogen, oxygen and water vapor.

3. The method according to claim 2 wherein the deposited layer is greater than 0.5 μm thick.

4. The method according to claim 3 wherein the layer is deposited at a rate greater than 10 nm/sec.

5. The method according to claim 4 further comprising heating the substrates to an initial temperature of 30° to 250° C.

6. The method according to claim 5 further comprising magnetically confining a glow discharge plasma to a closed loop adjacent the target.

7. The method according to claim 6 wherein the source-to substrate distance is 3 to 9 cm.

8. The method according to claim 7 wherein the total pressure is $10^{-3}$ to $2.5 \times 10^{-2}$ torr.

9. The method according to claim 8 wherein the target material is selected from the group consisting essentially of 99% or greater Al, Al — 2% Si and Al — 4% Cu — 2% Si.

10. The method according to claim 9 wherein the reactive gas is nitrogen at a pressure of $10^{-7}$ to $10^{-5}$ torr, and the initial substrate temperature is less than 85° C.

11. The method according to claim 9 wherein the reactive gas is water vapor.

* * * * *